(12) United States Patent
Okada

(10) Patent No.: US 8,141,006 B2
(45) Date of Patent: Mar. 20, 2012

(54) PHOTOMASK DATA PROCESSING METHOD, PHOTOMASK DATA PROCESSING SYSTEM AND MANUFACTURING METHOD

(75) Inventor: Tomoyuki Okada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 372 days.

(21) Appl. No.: 12/401,252

(22) Filed: Mar. 10, 2009

(65) Prior Publication Data
US 2009/0228860 A1    Sep. 10, 2009

(30) Foreign Application Priority Data

Mar. 10, 2008  (JP) ................................. 2008-060118

(51) Int. Cl.
*G06F 17/50* (2006.01)
(52) U.S. Cl. ........................................... 716/53; 716/54
(58) Field of Classification Search ................... 716/53, 716/54
See application file for complete search history.

(56) References Cited

U.S. PATENT DOCUMENTS

| | | | |
|---|---|---|---|
| 6,453,452 B1* | 9/2002 | Chang et al. .................... 716/53 |
| 7,669,158 B2* | 2/2010 | Kamat ........................... 716/118 |
| 2002/0108098 A1* | 8/2002 | Igeta ............................... 716/21 |
| 2002/0152449 A1* | 10/2002 | Lin ................................. 716/17 |
| 2003/0018948 A1* | 1/2003 | Chang et al. ..................... 716/8 |
| 2003/0140328 A1* | 7/2003 | Cobb et al. ..................... 716/19 |
| 2003/0177451 A1* | 9/2003 | Aleshin et al. .................... 716/2 |
| 2003/0237063 A1* | 12/2003 | Kauth et al. ...................... 716/5 |
| 2004/0060034 A1* | 3/2004 | Cote et al. ....................... 716/21 |
| 2004/0123265 A1* | 6/2004 | Andreev et al. ................. 716/21 |
| 2005/0064302 A1 | 3/2005 | Kotani et al. |
| 2005/0216875 A1* | 9/2005 | Zhang et al. ...................... 716/9 |
| 2006/0059443 A1* | 3/2006 | Kauth et al. ...................... 716/2 |
| 2006/0075371 A1* | 4/2006 | Kamat ............................ 716/11 |
| 2007/0074146 A1 | 3/2007 | Tanaka et al. |
| 2007/0277145 A1* | 11/2007 | Scaman ......................... 716/19 |
| 2008/0046849 A1* | 2/2008 | Choi ................................ 716/6 |
| 2008/0134130 A1* | 6/2008 | Baum et al. .................... 716/21 |
| 2008/0141195 A1* | 6/2008 | Torres Robles et al. .......... 716/5 |
| 2008/0168419 A1* | 7/2008 | Burkhardt et al. .............. 716/21 |
| 2008/0250374 A1* | 10/2008 | Lucas et al. ...................... 716/9 |
| 2008/0256500 A1* | 10/2008 | Cobb et al. ....................... 716/5 |
| 2008/0282211 A1* | 11/2008 | Culp et al. ........................ 716/8 |
| 2008/0301611 A1* | 12/2008 | Word et al. ....................... 716/9 |
| 2008/0320435 A1* | 12/2008 | Burkhardt et al. .............. 716/21 |

(Continued)

FOREIGN PATENT DOCUMENTS

JP    2004-502961 T    1/2004

(Continued)

*Primary Examiner* — Suresh Memula
(74) *Attorney, Agent, or Firm* — Fujitsu Patent Center

(57) ABSTRACT

A computer-implemented method, of processing design data to obtain photomask data, includes: selecting, amongst design data, data representing a first cell; selecting a first area in said first cell for which a configuration of a corresponding first pattern is influenced by patterns arranged outward relative to said first cell area; selecting a second area other than said first area in said first cell; constructing a hierarchical structure for said data representing said first cell area that includes said first area and said second area; subjecting the first area to optical proximity correction on the basis of a relationship between the first pattern and the patterns arranged around said first cell area; performing optical proximity correction in said second area on the basis of the first pattern; and synthesizing the corrected first area and the corrected second area, according to the hierarchical structure, to obtain photomask data.

17 Claims, 12 Drawing Sheets

U.S. PATENT DOCUMENTS

| | | | |
|---|---|---|---|
| 2009/0037861 A1* | 2/2009 | Chen et al. | 716/7 |
| 2009/0077527 A1* | 3/2009 | Gergov et al. | 716/21 |
| 2009/0113359 A1* | 4/2009 | Chew et al. | 716/4 |
| 2009/0187871 A1* | 7/2009 | Cork | 716/11 |
| 2009/0199142 A1* | 8/2009 | Arunachalam et al. | 716/5 |
| 2009/0199151 A1* | 8/2009 | Banerjee et al. | 716/20 |
| 2009/0241077 A1* | 9/2009 | Lippincott et al. | 716/5 |
| 2009/0241086 A1* | 9/2009 | Saito et al. | 716/19 |
| 2010/0153894 A1* | 6/2010 | Kamat | 716/5 |
| 2010/0223583 A1* | 9/2010 | Kauth et al. | 716/5 |

FOREIGN PATENT DOCUMENTS

| | | |
|---|---|---|
| JP | 2005-84101 A | 3/2005 |
| JP | 2007-86587 A | 4/2007 |
| WO | WO9914637 | 3/1999 |

* cited by examiner

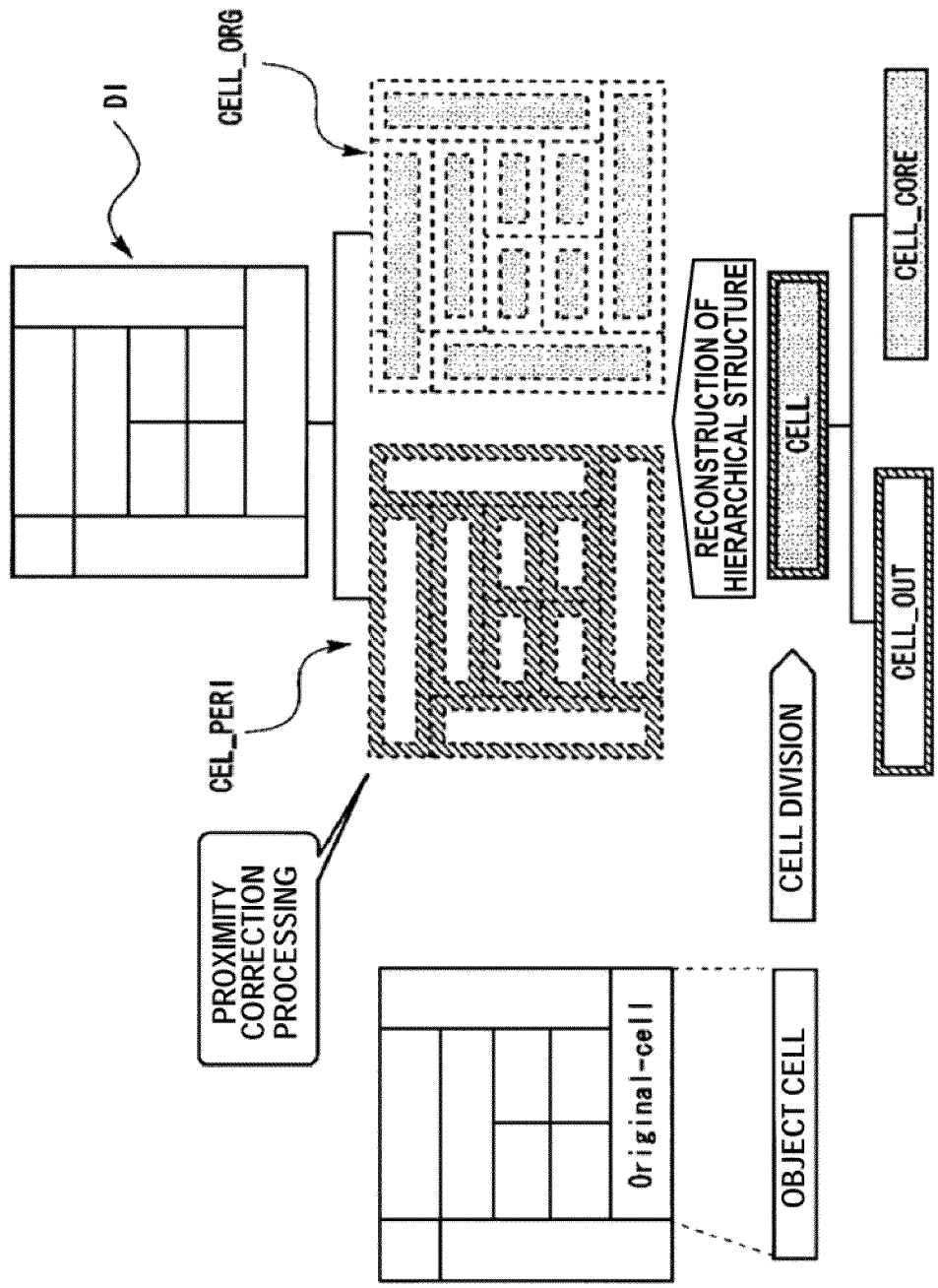

PHOTOMASK DATA PROCESSING METHOD, PHOTOMASK DATA PROCESSING SYSTEM AND MANUFACTURING METHOD

CROSS REFERENCE TO RELATED APPLICATION

This application is based upon and claims the benefit of priority from the prior Japanese Patent Application No. 2008-60118 filed on Mar. 10, 2008, the entire contents of which are incorporated herein by reference.

BACKGROUND

1. Field

The present invention relates to a technique for processing photomask data and a photomask manufacturing technique using the same.

2. Description of Related Art

To produce the extremely fine patterns of today's large-scale integrated (LSI) semiconductor circuits, high precision patterning techniques are required. In high precision patterning, processing to correct pattern data, such as optical proximity correction, is applied to design data. Processing to correct pattern data is executed to form the pattern intended to be transferred over a semiconductor substrate from design data. In processing to correct pattern data, the pattern shape of design data is deformed by using a rulebase or optical simulation. For this reason, when processing to correct pattern data is to be applied, the volume of pattern data (which may as well be referred to as graphic symbols) becomes enormous along with the progress of the cutting-edge technology, and the processing time elongates. This invites a significantly extending trend of the mask data processing time taken to fabricate transfer masks for use in transfers.

In conventional processing to correct pattern data such as optical proximity correction, the pattern in the design data is corrected in accordance with a file of designated conditions (pattern interval, pattern width and optical conditions) on the basis of the relationship between the pattern data of the pattern to be worked on itself and adjoining pattern data. In such processing to correct pattern data, a higher processing speed is sought by using parallel correction processing and distributed processing on the design data. However, along with the increasing complexity of processing ensuing from the rising precision of correction processing, the growing fineness of the pattern invites an ever greater scale of pattern data. This invites a significant elongation of the execution time taken by the computer to accomplish correction processing.

The time taken by processing to correct pattern data tends to increase with the number of units of pattern data. Conventionally, correction is processed on all pattern data in accordance with a file of designated conditions (pattern interval, pattern width and optical conditions). However, as disclosed in National Publication of International Patent Application No. 2004-502961, it is also proposed to perform optical proximity correction while maintaining the hierarchical structure of design data.

Yet, when correction processing is to be executed by utilizing the hierarchical structure of design data, the regularity of the reiterative pattern is often disturbed by the influence of proximate patterns. As a consequence, the processing is not completed within the desired time limit, giving rise to a problem of an extended length of time taken by the processing. By another method to reduce the time taken by processing, as disclosed in Japanese Patent Laid-Open No. 2007-86587 and Japanese Patent Laid-Open No. 2005-84101, the pattern having gone through proximity correction may be directly registered into the design data as a library, and the library may be referenced as required. However, there is a problem as a matter of real execution that, unless the influences of patterns present around the library pattern are compensated for, no output of normal proximity correction processing can be obtained. Moreover, patterns around the library pattern differ with each individual semiconductor device to be designed. Even in the same semiconductor device, surrounding patterns differ with the position in which the library pattern is arranged. Therefore, this technique can provide no realistic solution.

SUMMARY

An embodiment of the present invention provides a computer-implemented method of processing design data to obtain photomask data, such a method including: selecting, amongst design data, data representing a first cell; selecting a first area in said first cell for which a configuration of a corresponding first pattern is influenced by patterns arranged outward relative to said first cell area; selecting a second area other than said first area in said first cell; constructing a hierarchical structure for said data representing said first cell area that includes said first area and said second area; subjecting the first area to optical proximity correction on the basis of a relationship between the first pattern and the patterns arranged around said first cell area; performing optical proximity correction in said second area on the basis of the first pattern; and synthesizing the corrected first area and the corrected second area, according to the hierarchical structure, to obtain photomask data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 3 shows an example of image of the hierarchical structure of design data;

DESCRIPTION OF EXAMPLE EMBODIMENTS

Figure 1:
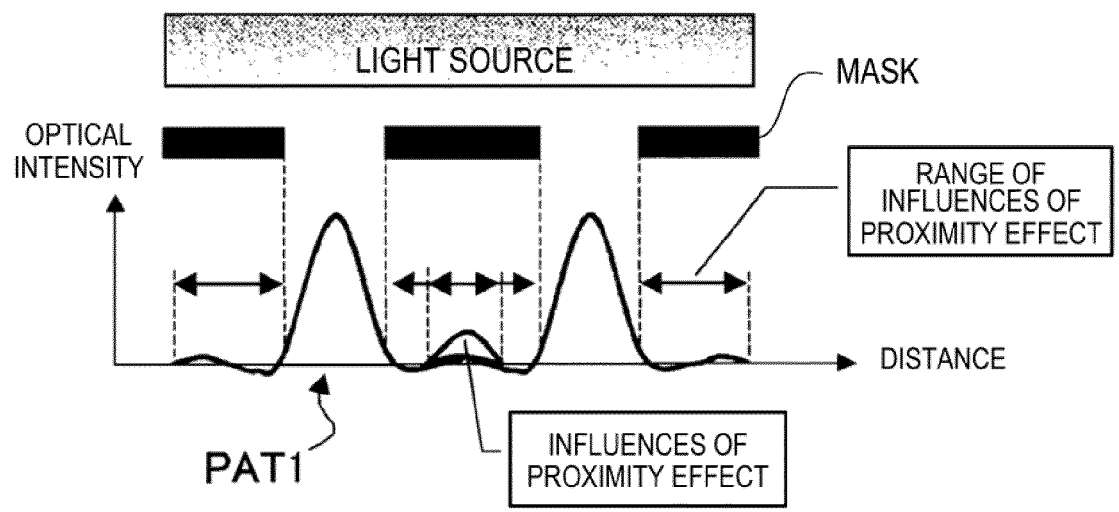
FIG. 1 outlines the optical proximity effect.

A pattern data processing system for a semiconductor device, which is an example of an embodiment of the present invention, and a mask manufacturing method using processed pattern data will be described below with reference to accompanying drawings. The configuration of the embodiment is merely an example, and nothing to limit the invention.
<Outline of Pattern Data Processing System>

When design data are to be subjected to optical proximity correction, two methods are available including (1) one which uses the hierarchical structure and (2) the other using a pattern having gone through proximity correction. Each has an effect to shorten the length of time taken to execute correction processing. This embodiment applies these techniques in even more efficient and practically useful ways. For this purpose, this embodiment reconstructs the hierarchical structure of design data and outputs design data permitting easier correction processing. This pattern data processing system has a function to correct optical proximity at the time of producing mask data.

First, a cell area which is the unit of executing optical proximity correction is recognized, and a boundary area with a pattern or a cell adjoining that cell area is determined. This boundary area can be, for instance, a belt area surrounding the original cell area, defined from the outer circumference toward the inner part of the cell area by a prescribed dimension. Processing to demarcate this boundary area vis-à-vis the original cell area is executed. Then, the inner area and the boundary area of the cell area farther inside that boundary area are demarcated from each other. The width of the boundary area is set to a distance that reduces if not prevents the proximity effect of any pattern or cell outside the cell area from distorting the inner area inside the boundary area. Deterring the proximity effect in this context means that variations in the pattern shape attributable to the proximity effect are reduced so as not to exceed a threshold.

Further, the data in the separated inner area and boundary area are reconstructed into a hierarchical structure branched under a top cell. The hierarchical structure is so reconstructed as to make the pattern shape as referenced from the top cell the same as the pattern shape before reconstruction.

The top cell here means the cell from which to reference the design data for the whole semiconductor device into which a plurality of hierarchical structures are to be assembled. The top cell can be regarded as the supreme hierarchical structure including the whole semiconductor device to be designed. The branching position in the hierarchical structure need not be immediately below the top cell. The branching may be positioned at a lower level according to the processing by the system.

Then, by using the design data whose hierarchical structure has been reconstructed, the inside of the cell area boundary and the boundary area are subjected to optical proximity correction. This enables the inside of the area boundary also reusable for another LSI than the semiconductor device which is the current object of processing. In reuse, the whole optical proximity correction processing may be completed by processing optical proximity correction of only the separated boundary.

After this correction processing is performed, the data are converted into drawing data of a mask drawing device for fabricating a mask. Then, a drawing device for photomask production is caused to read the drawing data in, mask drawing is carried out, and in this way the desired photomask can be fabricated by performing development, etching, resist removal and washing.

As described above, this embodiment facilitates processing such that a cell in which optical proximity correction is to be processed may be more easily separated into an inner area and a boundary area. As a result, unlike conventional practices, all the cells need not be subjected to correction processing. Thus, in this embodiment, the hierarchical structure is reconstructed into another hierarchical structure of design data which facilitates processing of the pattern in the cell independently of patterns around the cell by separating the cell into its inner area and boundary area. It is also possible to incorporate into this hierarchical structure a cell having already gone through proximity correction. This embodiment facilitates a reduction in the effective quantity of pattern data to be processed and a significant if not substantial reduction of the time taken to process proximity correction compared with conventional methods. This can lead to significant reductions in the consumption of computer resources needed in photomask fabrication and/or significant shortening of the time needed for generating mask drawings.

<Impacts of Optical Proximity Effect on Pattern Shape>

FIG. 1 outlines the optical proximity effect. FIG. 1 shows the distribution of optical intensity when light emitted from a light source is projected on a semiconductor substrate after having passed a light-transmissive transparent part on a mask. The rest of the mask other than the transparent part is covered by a shield part and intercepts light. When the pattern size of the transparent part becomes about as small as the wavelength of light, diffracted light sneaks into even the unexposed part (where the shield part is projected) on the semiconductor substrate. Especially when the pattern becomes extremely fine, the pattern size varies, affected by the optical intensity influences of proximate patterns among one another.

This varied value is assessed, when patterns formed of a plurality of lines and spaces is exposed to light, by the intervals of those patterns and an error occurring in those pattern intervals. It can be supposed that the range of pattern intervals affected correspond to distances for which the error exceeds the threshold. This lower limit of the pattern intervals, namely the range affected by the error, is determined by such optical conditions as the number of apertures NA of the optical system and the apparent size σ (partial coherence) and process conditions including the resist. Such a phenomenon is called the optical proximity effect. FIG. 1 shows an exemplary case in which the optical intensity has increased in a non-exposed part adjoining the intended part to be exposed PAT1. Therefore, if the distance from the exposed part and the optical intensity distribution are measured in advance, the range affected by the optical proximity effect can be identified.

Figure 2:
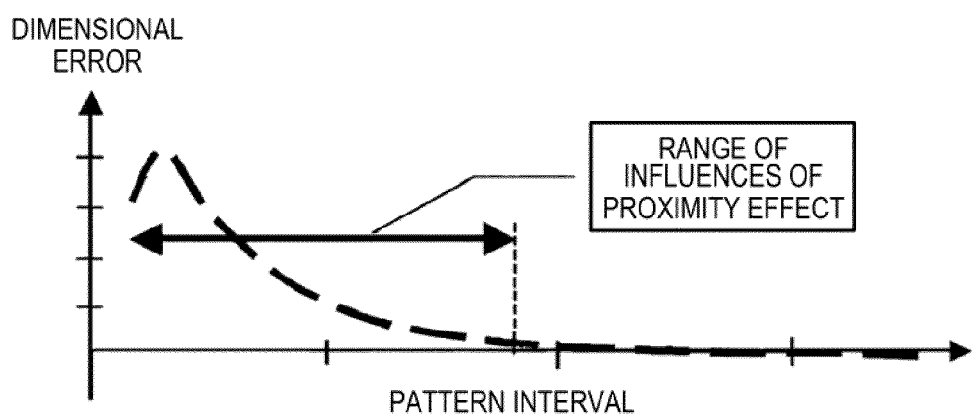
FIG. 2 shows one example of result of measuring the range affected by the optical proximity effect.

FIG. 2 shows one example of result of measuring the range affected by the optical proximity effect. Herein, the wavelength of the light from the exposing device is set to the value at the time of exposure, and an assessment pattern including a plurality of lines and spaces is exposed to light and the dimensional error is assessed. In FIG. 2, the abscissa represents the pattern interval of the assessment pattern, including lines and spaces, and the ordinate represents the dimensional error, namely the extent of variation from the pattern size which the design targets. In this case, distances corresponding to pattern intervals where the dimensional error is kept within a sufficiently narrow range can be determined empirically as the range where the proximity effect influences the dimensional error.

<Example of Data Processing>

An example of design data processing by this pattern data processing system will be described below. In the description of this case of processing, one aspect of this pattern data processing system will be taken up with reference to processing of proximity correction by way of example.

FIG. 3 shows an example of image of the hierarchical structure of design data to be processed by this pattern data processing system. The design data are structured by combining a plurality of cells. The cell here refers to a set of graphic symbols corresponding to a portion of a circuit or a circuit part defined by a database such as Macro Library. Usually, design data are structured by combining a plurality of cells hierarchically. For instance, a memory block is structured by arraying memory cells. Input/output circuit cells are arranged around the memory block. Then, a new superior cell is defined from the memory block and the input/output circuit to constitute a built-in memory. Out of such a plurality of cells, the cell in the supreme position (or at a specific level other than the supreme position) in the hierarchical structure and relevant to the whole semiconductor device to be designed is referred to as the top cell.

In a plurality of cells constituting a semiconductor device, there are cells to be subjected to proximity correction. Such cells to be corrected are also present under the hierarchical structure to be referenced from the top. This pattern data processing system separates each cell to be corrected into a boundary area of a prescribed width close to the outer circumference of the cell area and an inner area inward vis-à-vis the boundary area. Further by replacing the default pattern corresponding to the inside of the cell area boundary with an optical proximity corrected pattern, the correction processing is completed. On the other hand, correction processing is executed on the boundary area of the cell area together with a pattern outside the cell area or an external cell. Finally, the inner area and the boundary area of the cell area are synthesized to form design data or mask drawing data corresponding to the semiconductor device from the top cell down.

FIG. 3 shows the concept of the processing described above, in which this pattern data processing system generates boundary lines for separating the cell area of the design data D1 into the inner area (CELL_CORE) and the boundary area (CELL_OUT), then, this pattern data processing system processes the separation based on these boundary lines.

The boundary lines here are generated on the basis of a distance which achieves substantial reduction if not immunity from proximity effects arising from other patterns present outside the cell area or from other cells. Such a distance may be empirically determined from parameters including the pattern interval and pattern size or the wavelength or the lens characteristics of the exposing device.

For reconstruction of the hierarchical structure, information on the arrangement of separated cells can be referenced from the top cell. That is, a cell name which does not duplicate existing cell name is given to the separated boundary area, which is so arranged as to manifest the same pattern shape before the separation as referenced from the top cell. In this case, to facilitate separation of the cell area into the inner area and the boundary area, branching immediately underneath the top cell is recommendable. For instance, the structure of the cell belonging to one of the branches immediately underneath the top cell (e.g. CELL_ORG) is left as it is, and the pattern of the inner area is left within each cell. On the other hand, a cell (CELL_PERI) for branching can be generated anew immediately underneath the top cell, and a pattern to be contained in the boundary area may be arranged.

Figure 4A:
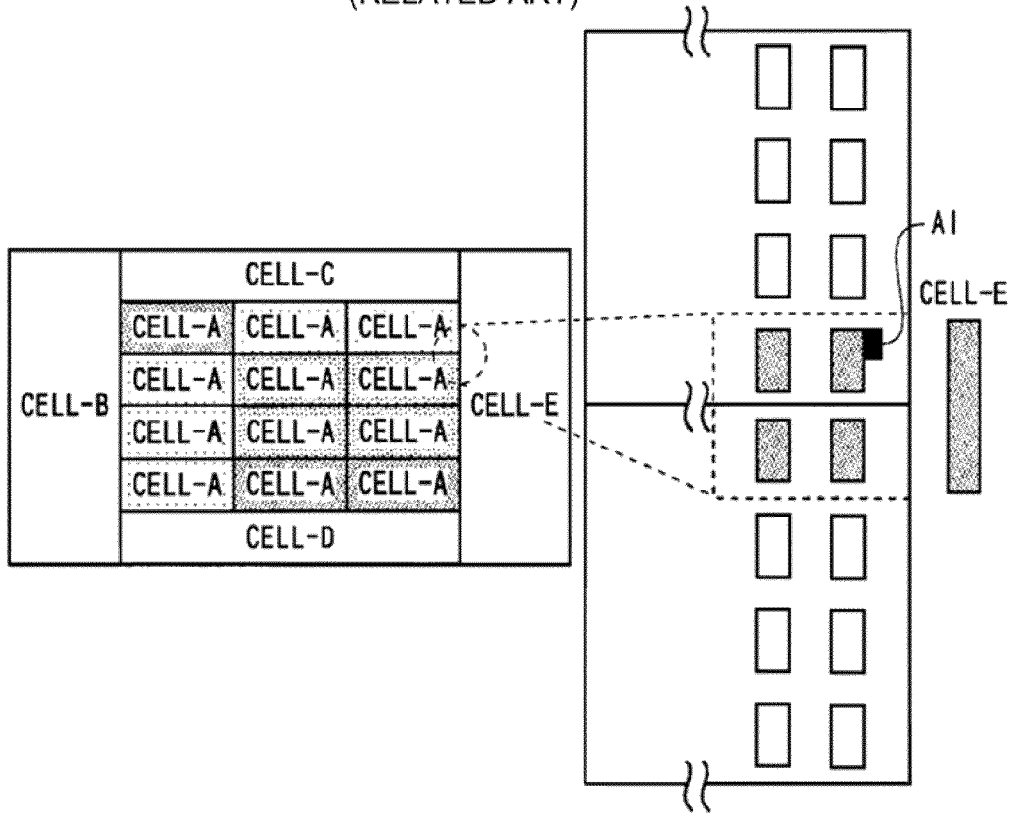
FIG. 4A shows an example from the Related Art.
Figure 4B:
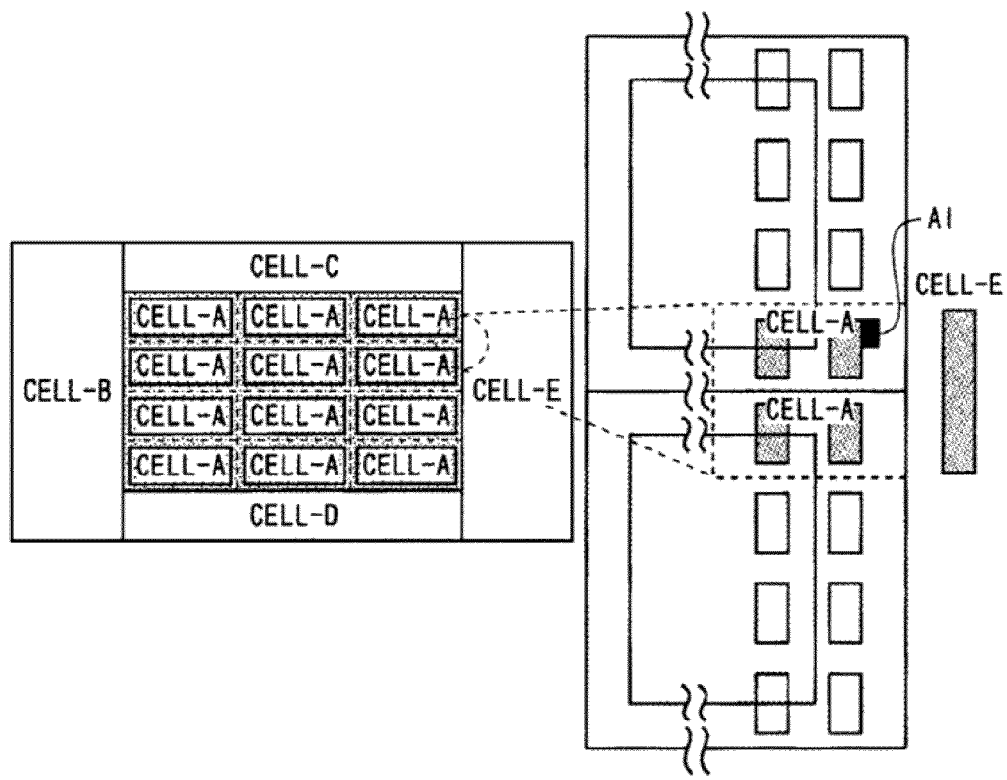
FIG. 4B illustrates an embodiment of the present invention.

FIG. 4A and FIG. 4B illustrate an example from the related art and an embodiment of the invention (the method of this pattern data processing system), respectively, in comparable images. The following description will refer to a semiconductor device wherein cells represented by CELL-A are arranged in a matrix of four lines by four columns, around which cells represented by CELL-B, CELL-C, CELL-D and CELL-E are arranged.

In the example from the related art as depicted in FIG. 4A, proximity correction processing is executed by utilizing the hierarchical structure of cells. In this example, however, cells are not separated into an inner area and a boundary area. Herein, cells CELL-A which were originally defined in the same library are subject to different proximity effects, varying with whether the adjoining cell is CELL-B, CELL-C, CELL-D or CELL-E, which differ in pattern shape. For this reason, the pattern after the processing of proximity correction differs among these cells. For instance, a part close to CELL-E would be augmented with an additional pattern A1. This change in pattern shape differs depending on the adjoining cell. Therefore, every one of what are positioned on the outer circumference of the 4×4 matrix in which cells CELL-A are arranged basically has a possibility of varying into a different shape. Thus, the correction processing differing with the mutually dependent adjoining cells means the possibility that cells CELL-A are unable to maintain a reiterative hierarchical structure.

In related art FIG. 4A, where it is impossible to process correction while maintaining the hierarchy of CELL-A, correction is processed with the hierarchical structure being developed to a flattened state. Thus, the design data originally configured of the 4×4 matrix and a single unit of CELL-A graphic information are now stated in CELL-A graphic information corresponding to 16 units.

On the other hand, in the processing by the embodiment of the invention shown in FIG. 4B, a boundary is provided which separates from each other the range in which proximity correction based on a pattern outside the cell affects the pattern shape and the range in which it does not. Then, dividing the cell into the boundary area outside the boundary line and the inner area inside the boundary line facilitates maintaining the regularity of reiteration.

As shown in FIG. 4B for instance, by so setting the width of the boundary area as not to let the influences of CELL-B, CELL-C, CELL-D and CELL-E reach inside the boundary, the additional pattern A1 generated by the correction is deterred if not prevented from appearing in the inner area. By varying the design data into such a structure, this pattern data processing system is enabled to carry out correction processing without being affected by the presence of any adjoining pattern resulting from proximity correction or the like.

Figure 5:
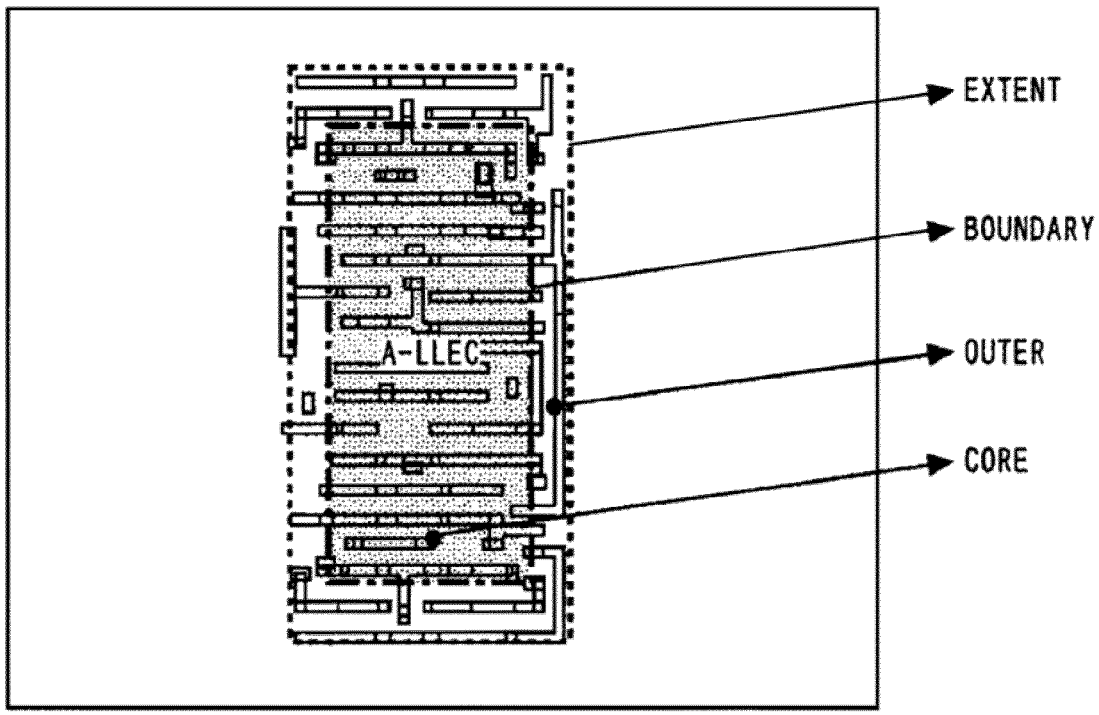
FIG. 5 shows an example of pattern of design data for a specific semiconductor device.

FIG. 5 shows an example of pattern of design data for a specific semiconductor device. In FIG. 5, a cell area is shown demarcated into an outer area (OUTER) and an inner area (CORE) by way of example. Further, a cell correction boundary line (BOUNDARY) is shown between the outer area (OUTER) and the inner area (CORE). Also, EXTENT is shown as the outermost circumference (presence area) of the cell area.

Figure 6:
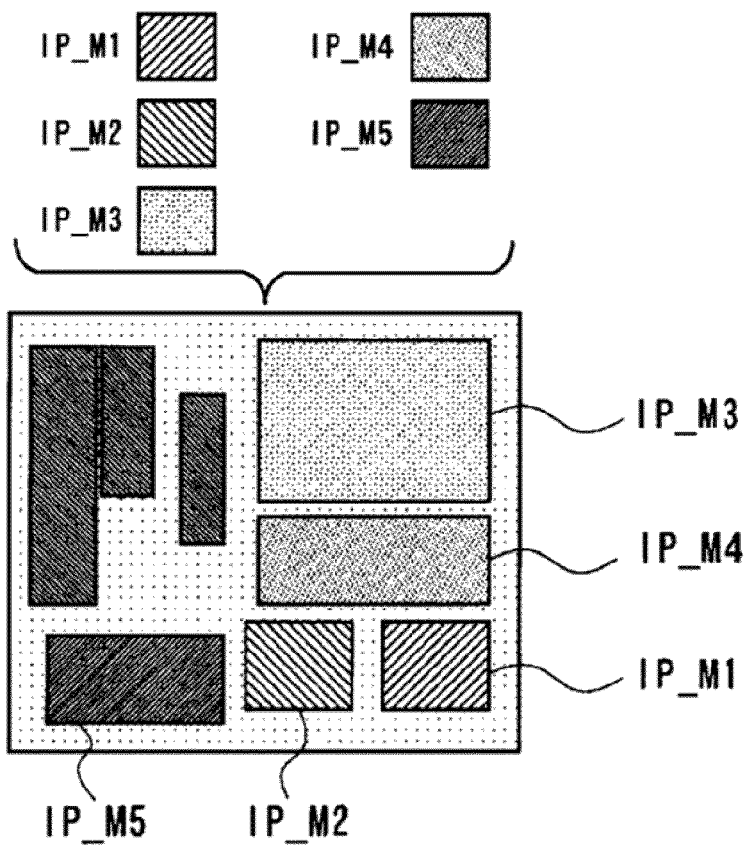
FIG. 6 shows an example of pattern of design data.

FIG. 6 shows an example of pattern of design data. In this example, cells represented by IP_M1 through IP_M5 are arranged in the semiconductor device. As shown in FIG. 6, design data describing a semiconductor device, such as an LSI, is configured by putting together many groups of patterns known as macros or libraries. Of these cells, more than one can be objects of pattern separation by this pattern data processing system. Generally, design data of a semiconductor device are so arranged that each cell has in itself a structure in which other cells are referenced. Therefore, each cell and other cells referenced by that cell have a hierarchical structure. The cell to be corrected is present in such a hierarchical structure. Under the cell to be corrected, slave cells are also present.

Figure 7:
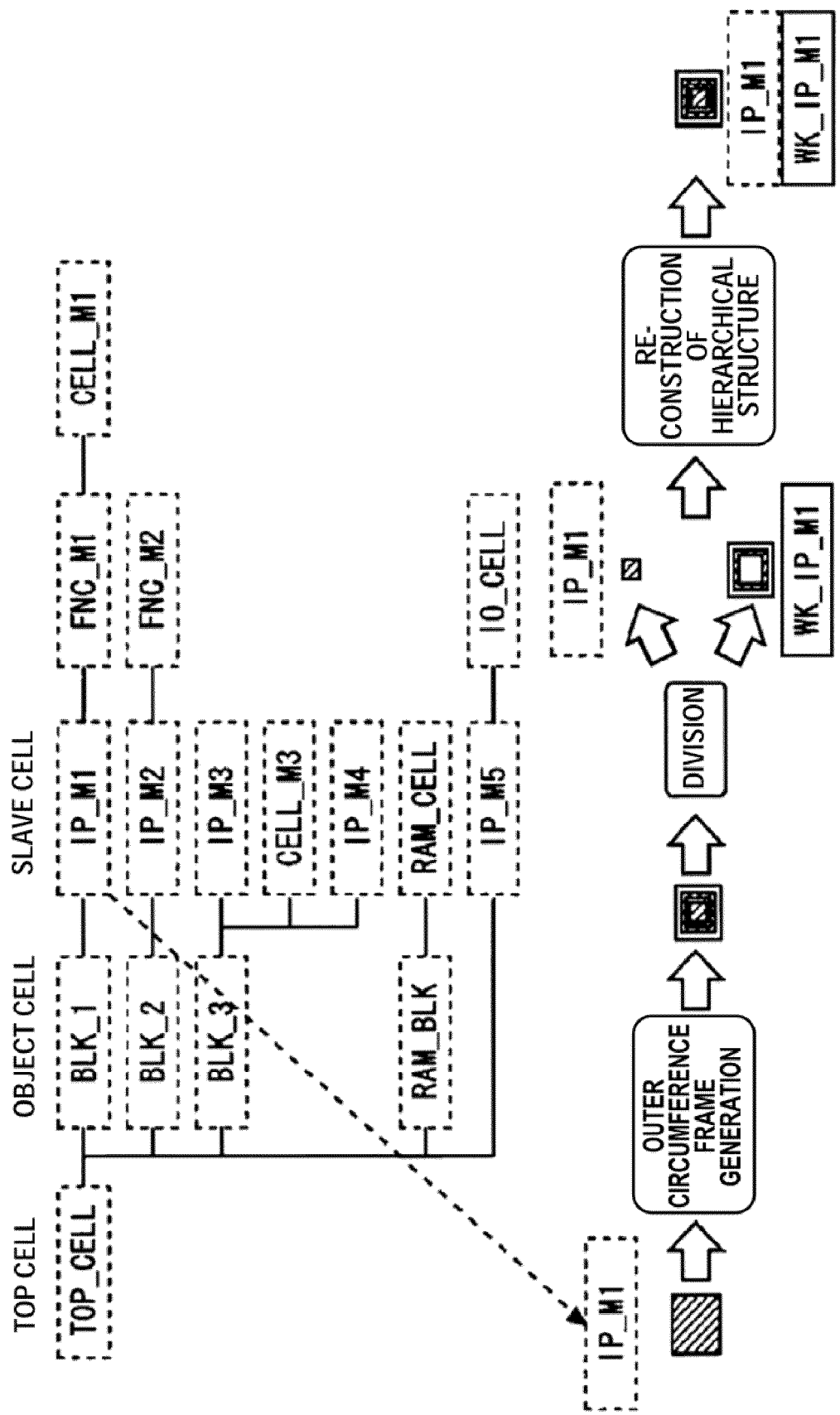
FIG. 7 shows an example of hierarchical structure of design data and outlines processing of that hierarchical structure.

FIG. 7 shows an example of hierarchical structure of the same design data as those in FIG. 6 and outlines processing of that hierarchical structure. In this semiconductor device, circuit blocks represented by BLK_1 through BLK_3 and RAM_BLK are arranged immediately underneath the top cell. Also, IP_M1 is arranged underneath BLK_1 as a slave cell. Underneath IP_M1, hierarchical levels such as FNC_M1 and CELL_M1 are defined. Underneath BLK2 and BLK3, too, IP_M2 and IP_M3 or IP_M4, respectively, are similarly arranged. Further, underneath RAM_BLK, RAM_CELL is arranged usually in a matrix. IP_M5 is arranged immediately underneath TOP cell. Description is dispensed here about the structure of cells not directly relevant to the processing of separation into boundary areas and inner areas by this pattern data processing system.

In FIG. 7, processing is outlined regarding IP_M1 as an example. For the pattern data processing system, each cell to be corrected is designated in a name identifying a cell (hereinafter referred to as the cell name) in, for instance, the design data (usually the interface format of LSI-CAD) by parameters such as the file of conditions. Also, the width of the boundary area, namely the dimension from the outer circumference of the cell in which a boundary line is to be generated is designated for the pattern data processing system.

First, the pattern data processing system searches for IP_M1, which is a cell to be corrected, on the basis of the designated cell name. The pattern data processing system searches for the design data of the pertinent cell, and extracts graphic data in the cell.

Next, the pattern data processing system generates a boundary line that is inward relative to the outer circumference of the cell (outer circumference frame generation) on the basis of the designated width of the boundary area. Then, the pattern data processing system divides the data in the cell into a boundary area and an inner area. The data in the inner area are left as they are in IP_M1, the original cell. On the other hand, the data in the boundary area are assigned a new cell name (e.g. WK_IP_M1), and a new cell is generated. The new generated cell is arranged in a position circumscribed about IP_M1 to deter if not prevent the layout from the top cell downward from being altered.

Figure 8:
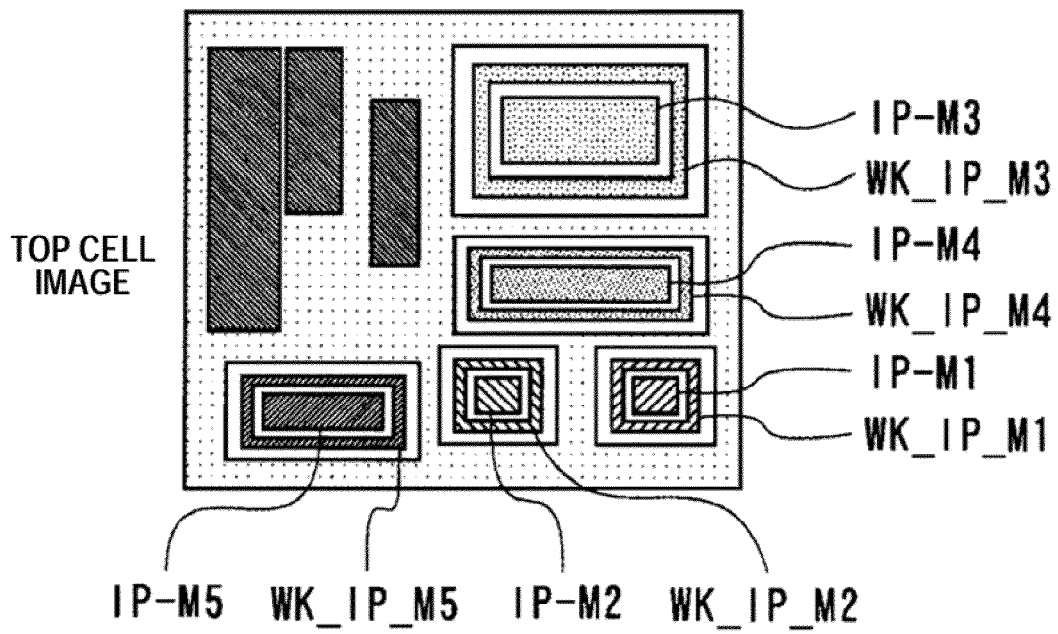
FIG. 8 shows an example of pattern resulting from division of cells to be corrected (from IP_M1 through IP_M5) into inner areas and boundary areas and definition of the boundary areas as new cells (from WK_IP_M1 through WK_IP_M5)

FIG. 8 shows an example of pattern resulting from division of cells to be corrected (from IP_M1 through IP_M5) into inner areas and boundary areas and definition of the boundary areas as new cells (from WK_IP_M1 through WK_IP_M5). In FIG. 8, to facilitate understanding, the boundary areas are hatched in a different pattern from the inner areas.

Figure 9:
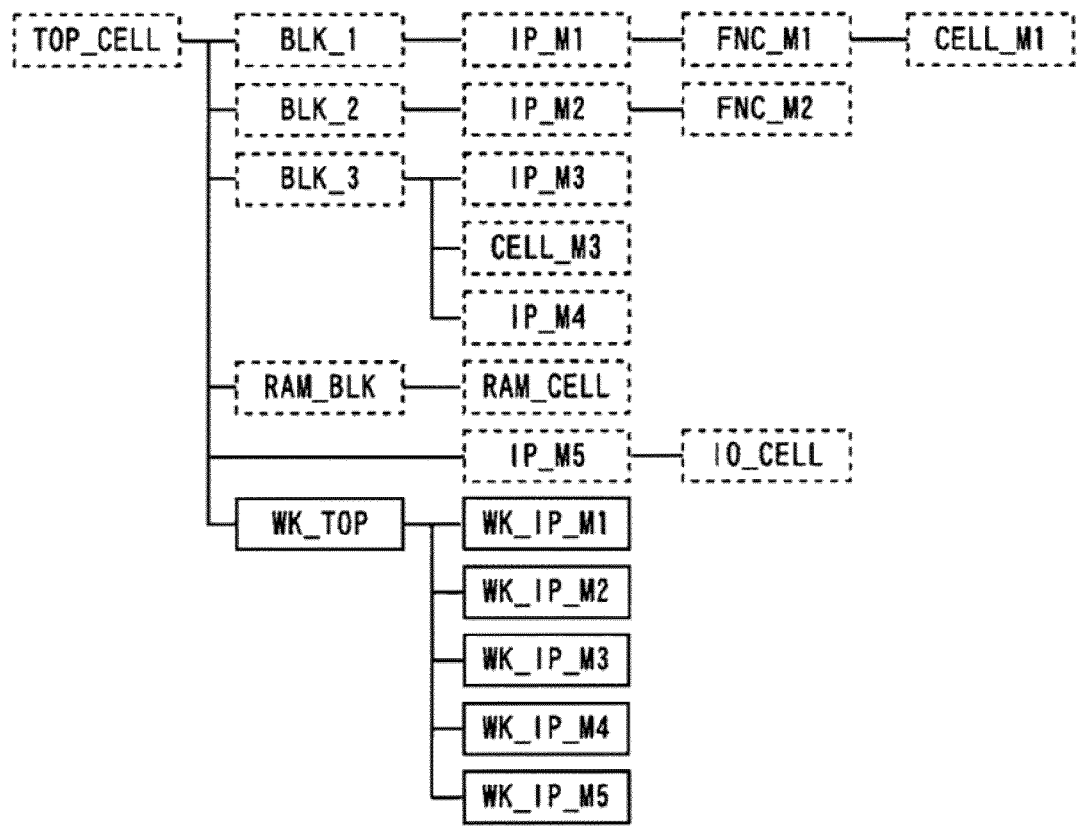
FIG. 9 shows an example of hierarchical structure separated into boundary areas and inner areas.

FIG. 9 shows an example of hierarchical structure separated into boundary areas and inner areas in this processing device. In this example, the hierarchical structure is broadly classified in two ways. Thus, after the cells to be corrected are separated into boundary areas and inner areas, a structure constituting a cell correction boundary area (WK_TOP) is added underneath the top cell. From WK_TOP downward, data of the boundary areas represented by WK_IP_M1 through WK_IP_M5 are arranged.

On the other hand, the hierarchical structure is altered nowhere else than at WK_TOP. Yet, boundary areas are deleted from the cells to be corrected (IP_M1 through IP_M5), leaving a structure containing the parts constituting the inner areas.

<System Configuration>

Figure 10:
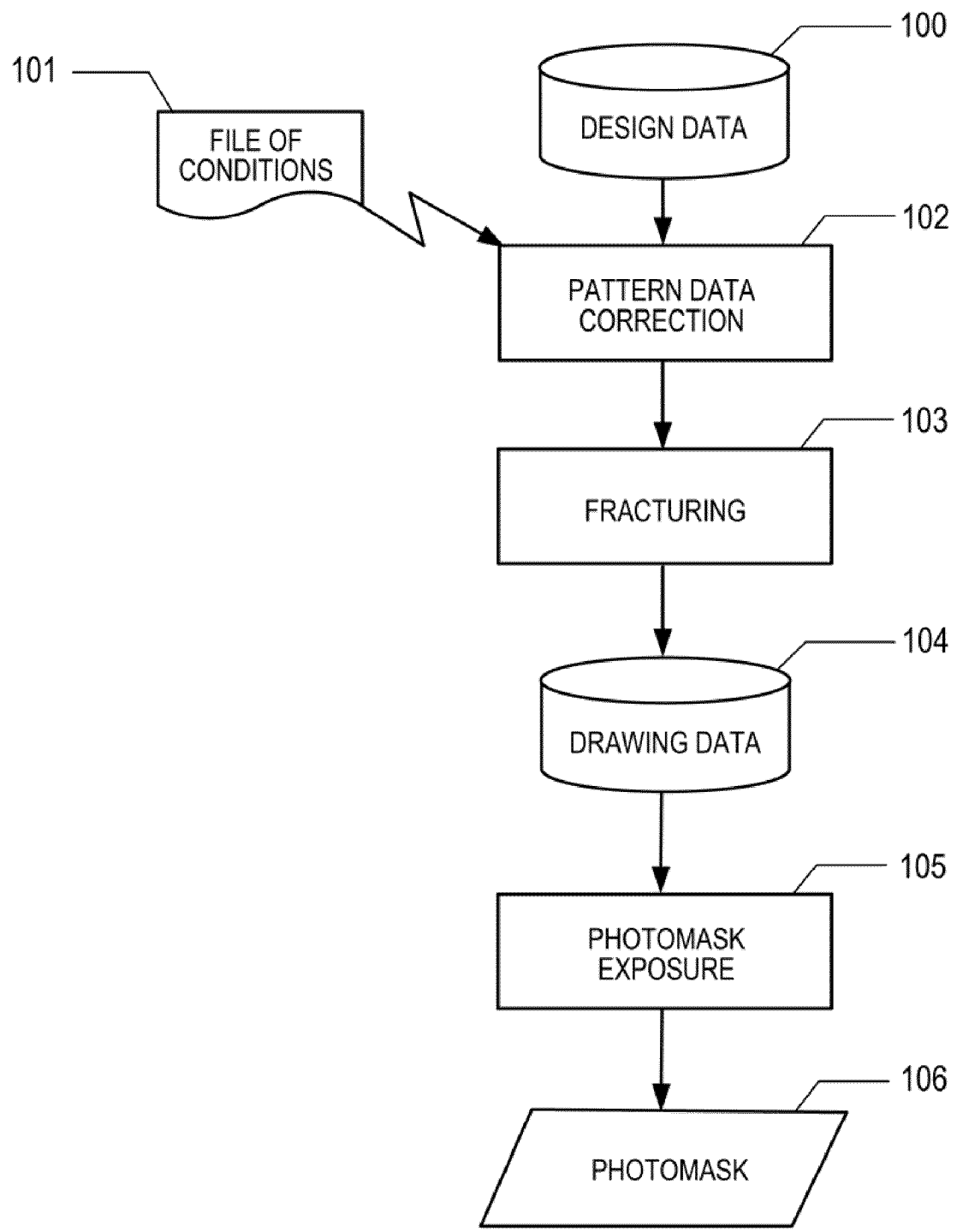
FIG. 10 charts an example of pattern data processing flow by a pattern data processing system.

FIG. 10 charts an example of pattern data processing flow by this pattern data processing system. Design data 100 and a file of conditions 101 are inputted to this pattern data processing system. Graphic data representing the whole semiconductor device are stated in the design data 100 in terms of a hierarchical structure of cells. On the other hand, the file name of design data to be processed, the name of the top cell in the design data, the layer to be processed, the names of cells to be corrected among the cells underneath the top cell, the conditions of correction and the width of the boundary area among other factors are designated in the file of conditions 101.

This pattern data processing system reads the design data as designated by the file of conditions 101. Then, this pattern data processing system selects the layer to undergo proximity correction, and sets an outer circumference line identify the range in which cell data are present in the cells to be processed. The outer circumference line shapes, for instance, a rectangle composed of the minima (XMIN, YMIN) and the maxima (XMAX, YMAX) of the coordinate values of graphic data in the cells. This outer circumference line provides information to make possible identification of the outermost circumference of the cells. Further, this pattern data processing system causes a cell correction boundary line to be set relative to the outer circumference line. The cell correction boundary line divides the boundary area that is affected by the proximity effect from patterns outside the cell and the inner area that are substantially not affected. The position of this cell correction boundary line is determined from the result of measuring the range affected by the optical proximity effect shown in FIG. 2.

After the cell correction boundary line is generated, overlapping of cells is removed to separate the inner area and the boundary area from each other, the hierarchical structure is developed in the cell and the data in the cell are made hierarchy-free. Further, this pattern data processing system keeps flattened data in store, and separates the pattern along the boundary line. Then, this pattern data processing system leaves as it is in the original hierarchical structure the part of the inner area within the correction boundary line. On the other hand, pattern data separated outside the correction boundary line are given a new cell name as a cell of the boundary area. Then, this pattern data processing system reconstructs the hierarchical structure by incorporating cells in the boundary area into the hierarchical structure underneath the top cell.

It has to be ensured then that the pattern shape itself of the semiconductor device as referenced from the top cell remains unchanged. Thus, the cell pattern in the separated boundary area is arranged in such a position that its distance to the pattern of the inner area remaining in the original hierarchical structure remains the same. Further, the cell pattern in the boundary area in contact with the pattern of the inner area before the separation is arranged in such a position as is in contact with the pattern of the inner area remaining in the original hierarchical structure. In this way, immediately underneath the top cell, a hierarchical structure in which cells containing the pattern of the boundary area are expressly indicated by assigning cell names such as WK_TOP is constructed as shown in FIG. 9. After this processing, regarding cells in the inner area, it is made easier also to process replacement with cells having undergone proximity correction.

Next in this pattern data processing system, pattern data are subjected to divisional proximity correction processing. Thus, this pattern data processing system individually performs processing to correct pattern data while checking pattern data in each cell area from the supreme level cell downward on the basis of a file of conditions (pattern interval, pattern width and optical conditions) for processing to correct pattern data. In that case, the pattern of the inner area may be individually corrected in the design data with data before the separation of the boundary area. The boundary area may be subjected to correction processing together with other cells outside the object cell (all the data of the semiconductor device except the inner area of the object cell) (102).

Next this processing device, after the processing to correct pattern data, processes fracturing (103) to prepare pattern data (drawing data 1014) for producing a photomask. Fracturing means processing to divide the pattern of design data usually stated in a polygon into a graphic form for the input form for the mask drawing device (e.g. a trapezoid). In the fracturing, removal of overlapping of patterns and other processing are also executed. Next, the drawing device for photomask production is caused to read in the drawing data and, after the implementation of drawing (105), the photomask is completed.

Figure 11:
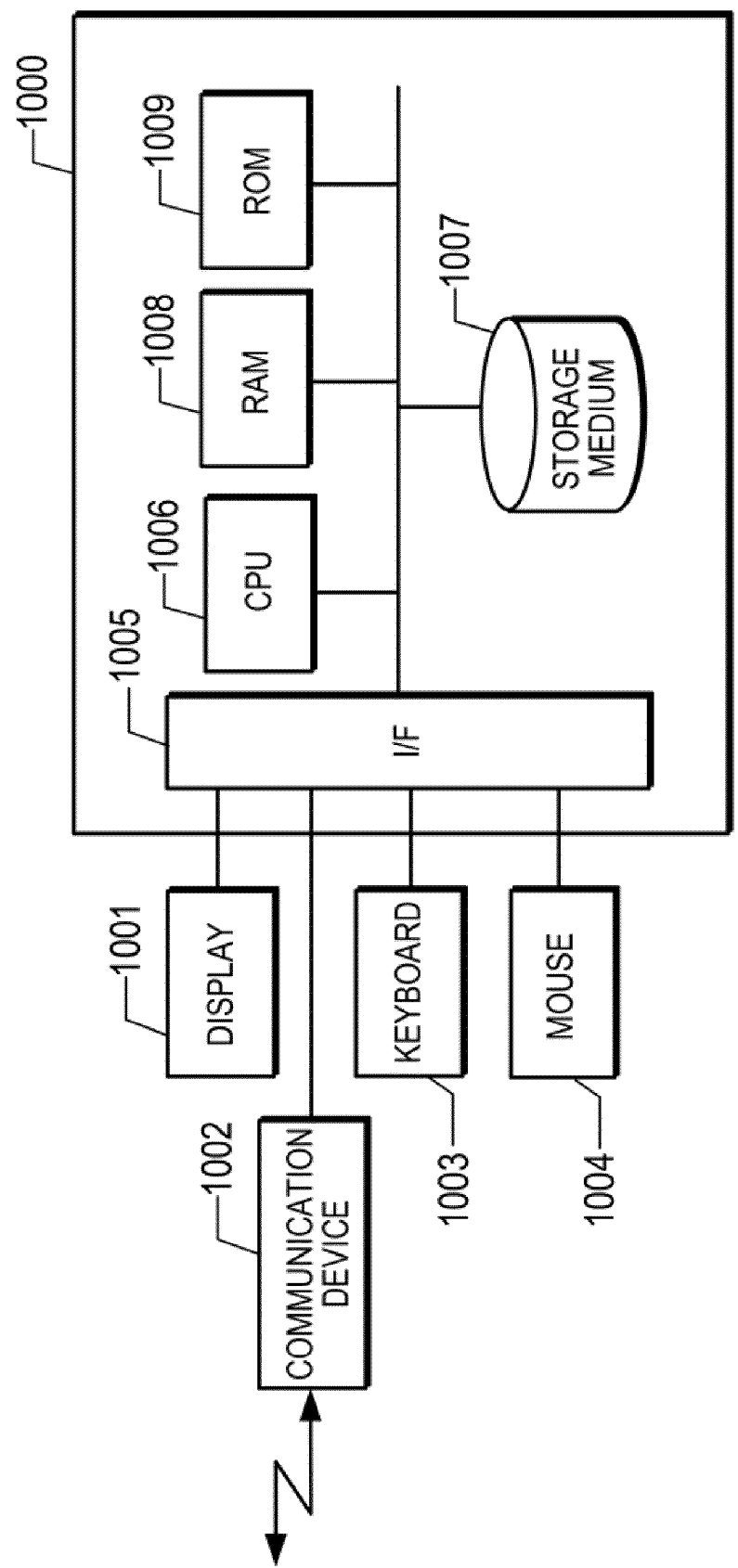
FIG. 11 shows an example of configuration of a pattern data processing system.

FIG. 11 shows an example of configuration of this pattern data processing system. This pattern data processing system is realized by mounting a computer program on a device such as a personal computer or a work station. The pattern data processing system in FIG. 11 includes a computer 1000, a display device 1001 connected to the computer 1000, a communication device 1002 and an input device. The input device includes, for instance, a keyboard 1003 and a pointing device such as a mouse 1004.

The method of processing to correct pattern data by this pattern data processing system can be realized, e.g., as a computer program executable by a computer. This computer program performs processing via an arithmetic unit such as a CPU 1006 and a storage unit such as a storage device which may be a storage medium 1007 or a RAM 1008. In a ROM 1009, a control program for controlling the basic actions of the computer 1000 and a computer program for realizing the functions of this pattern data processing system are stored. By executing this computer program, the method of processing correction of the design data of the semiconductor device is implemented as described above, and mask drawing data are produced. The computer environment for executing this correction processing and production of the mask drawing data is this pattern data processing system.

This computer program is installed into the computer 1000 via a communication device 1002 or a detachable recording medium (e.g. a DVD). Incidentally, a network to be connected to the communication device 1002 or the detachable recording medium is also used as a medium when inputting the produced mask drawing data to the mask drawing device.

<Detailed Procedure of Data Processing>

Figure 12A:
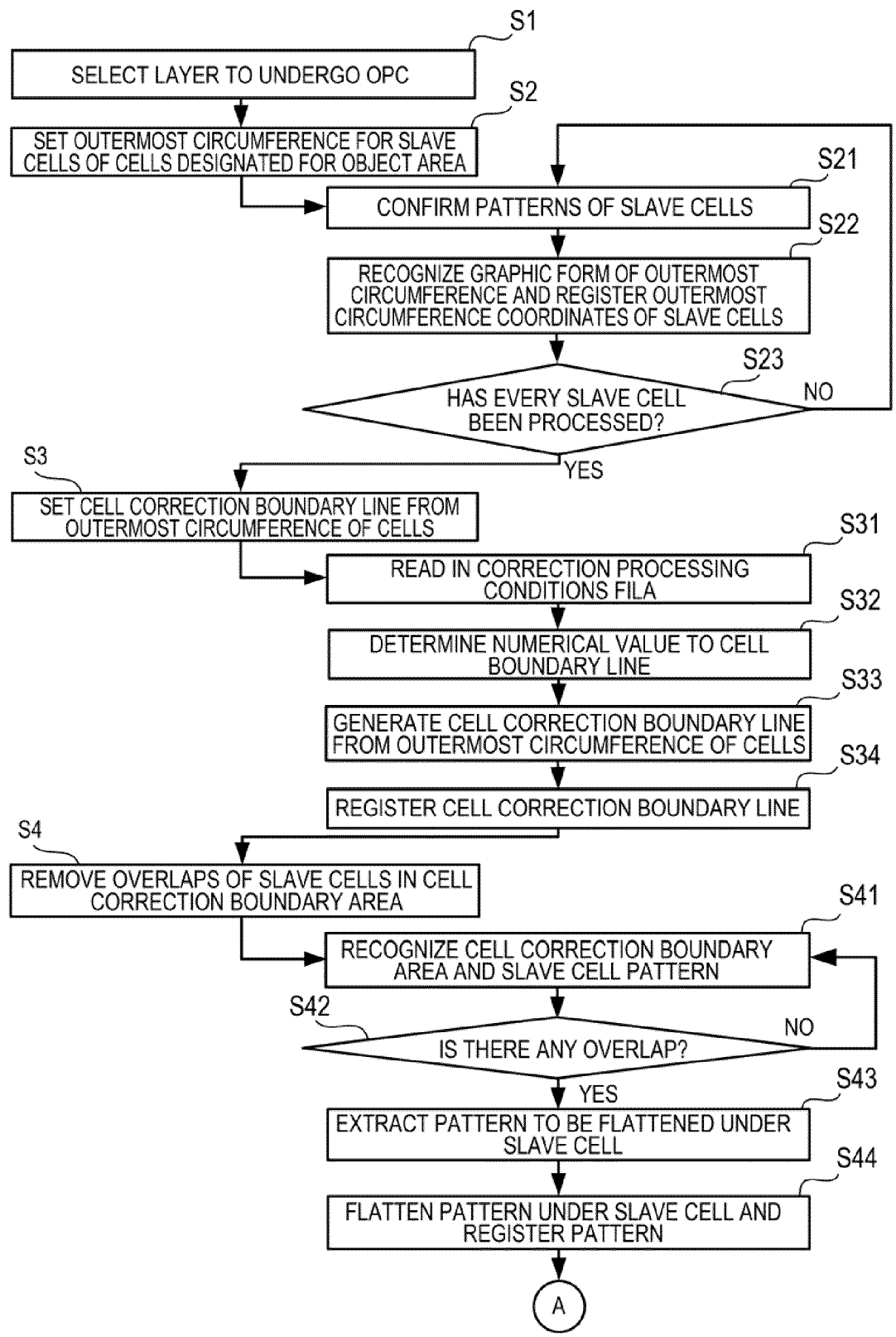
FIG. 12A charts an example of pattern data processing flow by a processing device.
Figure 12B:
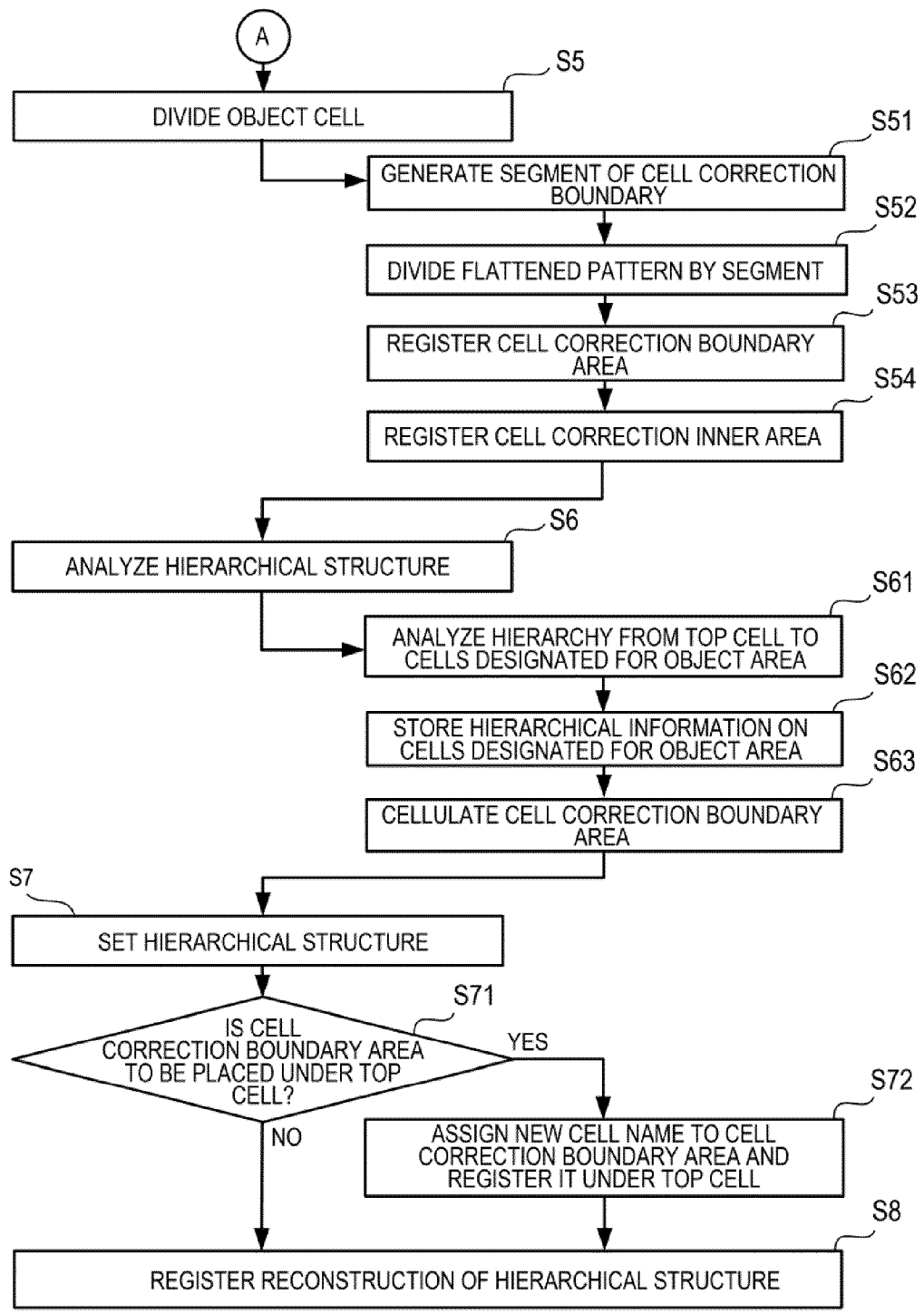
FIG. 12B charts an example of pattern data processing flow by a processing device.

FIG. 12A and FIG. 12B chart an example of pattern data processing flow by this pattern data processing system. This processing is realized by a computer program executed by the computer 1000 constituting the pattern data processing system. In this processing, this pattern data processing system first selects the object layer of optical proximity correction in accordance with the designation of the file of conditions 101 (S1). Then, the pattern data processing system executes processing to set the outermost circumference of slave cells among the object area-designated cells in the object layer (S2). The object area-designated cells here mean higher level ones of the cells subject to this processing including slave cells. By the object area-designated cells, the cell group to be processed can be designated in a broad frame. The cell names of the object area-designated cells are designated in the file of conditions 101. The processing here is to set lines indicating the outermost circumference (or a rectangular area, corresponding to the first cell area) on the lower level cells (hereinafter also referred to as slave cells) to be processed contained in the object area-designated cells.

In this processing, the pattern arrangement of the slave cells of each of the object area-designated cells is confirmed (S21). Thus, pattern data processing system takes out slave cells one by one, and extracts the maxima and the minima of the coordinates defining graphic forms in the taken-out slave cells as such and the cells defined and arranged at the levels underneath the taken-out slave cells. The maxima and the minima of the coordinates are determined in a state in which each graphic form or a lower level is arranged in a coordinate system referencing the original point of the slave cell being processed. Then, the pattern data processing system extracts the rectangle defined by the maxima (XMAX, YMAX) and the minima (XMIN, YMIN) of the coordinates of the graphic form, and registers the rectangle as the outermost circumference of the slave cells (S22). The CPU 1006 of the pattern data processing system executing this processing corresponds to the unit selecting the first cell area.

Next, the pattern data processing system determines whether or not every slave cell in the object area-designated cell has been processed (S23). If there is any slave cell not yet processed, the pattern data processing system returns the control to S21. Or if the processing of every slave cell has been completed by the determination at S23, the pattern data processing system advances the control to S3.

Though not mentioned in FIG. 12A, it is also possible to designate a plurality of object area-designated cells. In that case, it is determined before the processing at S3 whether or not every object area-designated cell has been processed. If there is any object area-designated cell not yet processed, the control can be returned to the beginning of S2 to repeat similar processing of the object area-designated cells not yet processed.

Next, the pattern data processing system sets a cell correction boundary line from the outermost circumference of cells in a dimension not affected by the optical proximity effect (S3). In this processing, the pattern data processing system reads conditions from the file of conditions 101 of correction processing (S31). Then it determines the numerical value from the outermost circumference of cells to the cell correction boundary line (S32). This value is to be set according to the result of measurement such as what is shown in FIG. 2 for instance. In this way, the boundary area from the outermost circumference of cells to the cell correction boundary line (first area) is finalized. The CPU 1006 of the data processing system executing this processing corresponds to the device which makes the first area definite. Incidentally, the setting of the cell correction boundary line also determines a second area surrounded by the cell correction boundary line.

The pattern data processing system generates a cell correction boundary line from the outermost circumference of cells to the determined position. Then, the pattern data processing system registers in a file the boundary area made definite by the cell correction boundary line (or coordinates which make definite the belt area of the boundary area from the outermost circumference of cells to the cell correction boundary line) (S34).

Next, the pattern data processing system executes removal of overlaps of slave cells on the cell correction boundary line (S4). The removal of overlaps of slave cells on the cell correction boundary line is processing to extract, out of the slave cells and cells positioned on levels underneath the slave cells, any pattern crossing the boundary area of the slave cells.

In this processing, the pattern data processing system recognizes the relationship between the boundary area of the slave cells and the pattern of the slave cells (S41). Then, it determines whether or not the boundary area set to the slave cells overlaps the pattern of the slave cells (S42). If there is no overlap, the whole of that pattern is considered to be contained in the inner area. Or if there is any overlap, that pattern is flattened in the position where it is arranged in the cell. This processing is applied to the pattern in every slave cell and the patterns in the cells underneath the slave cells to determine the pattern to be flattened (S43). Then the pattern selected as the object of flattening at S43 is flattened, the pattern is registered in the file (S44).

Next, the pattern data processing system divides the object cell (S5). First, the pattern data processing system generates a segment of the cell correction boundary line (S51), and divides the flattened pattern by the generated cell boundary line (S52). In this processing, a pattern positioned inside the cell correction boundary line is first acquired by the AND operation of, for instance, the rectangular area surrounded by the cell correction boundary (corresponding to the inner area) and the flattened pattern. Then, a pattern outside the cell correction boundary line is acquired by subtracting the pattern positioned in the acquired inner area from the flattened pattern.

Then, the pattern data processing system registers the pattern positioned outside the cell correction boundary line in a work file (or a memory) as the pattern of the boundary area (S53). Also, the pattern data processing system registers the pattern positioned inside the cell correction boundary line as the pattern of the inner area (S54). The registration in this case basically is processing to return, out of the divided patterns, the pattern present in the inner area to the original slave cells (or cells present at levels underneath the slave cells).

Next, the pattern data processing system executes processing to analyze the hierarchical structure (S6). Here the pattern data processing system analyzes the hierarchical structure from the top cell to the object area-designated cells to be corrected (S61). Analyzing a hierarchical structure means successively tracing back the master-slave relationship from the top cell to the object area-designated cells and figuring out the arrangement relationship of the object area-designated cells at the origin of the top cell. Then, the pattern data processing system stores the analyzed hierarchical structure of the object area-designated cells into a file (or a memory) (S62). In this case, the patterns of the inner area and of the boundary area are registered in the object area-designated cells.

Further, the pattern data processing system cellulates the pattern of the boundary area registered into the file by processing at S53 as the cell of the cell correction boundary area. More specifically, a new cell name is assigned to it (S63).

Next, the pattern data processing system sets a hierarchical structure (S7). The CPU 1006 which executes this processing corresponds to the device constructing the hierarchical structure. In this pattern data processing system, two different hierarchical structures can be reconstructed in accordance with the designation of the file of conditions 101. Thus, the pattern data processing system determines whether or not the cell correction boundary area is to be added immediately underneath the top cell (S71). If it is designated in the file of conditions 101 that the cell correction boundary area is to be added immediately underneath the top cell, a cell containing the newly generated pattern of the cell correction boundary area is added immediately underneath the top cell (S72). In this processing, the inner area is maintained as it is in the object cell.

Or if it is not designated in the file of conditions 101 that the cell correction boundary area is to be added immediately underneath the top cell, the original hierarchical structure of cells containing the pattern of the inner area and cells containing the pattern of the boundary area of the slave cells separated from the inner area are maintained immediately underneath each of the object area-designated cells. The structure so far described is registered as new design data (S8).

In the foregoing description, it was supposed that the object area-designated cell was designated and processing of division into inner areas and boundary areas was to be executed on the slave cells underneath. However, in place of such processing, the cells to be divided into inner areas and boundary areas may as well be directly designated. In that case, processing charted in FIG. 12 may enable the names of cells corresponding to the slave cells to be set in the file of conditions 101.

Figure 13:
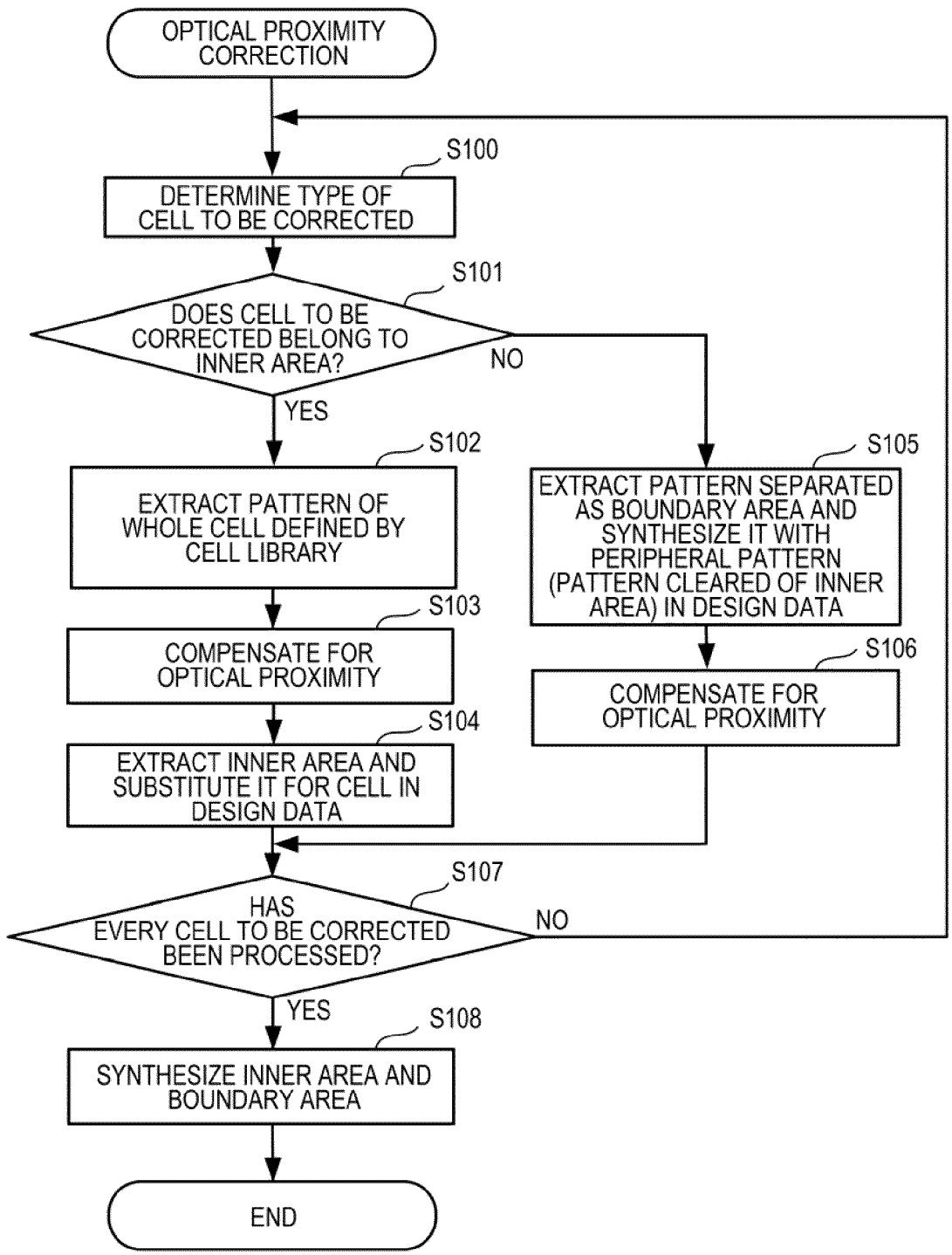
FIG. 13 shows an example of optical proximity correction processing of design data in which a hierarchical structure has been reconstructed.

FIG. 13 shows an example of optical proximity correction processing of design data in which a hierarchical structure has been reconstructed by this pattern data processing system. In this processing, the pattern data processing system first extracts the cells to be corrected out of the hierarchical structure from the top cell downward. The cells to be corrected are usually designated in the file of conditions 101. Then, this pattern data processing system determines the type of the cells to be corrected (S100). The type of cells means that whether the cells have a pattern corresponding to the inner area or a pattern corresponding to the boundary area. This pattern data processing system executes, in accordance with that determination (S101), correction processing appropriate for the determined type.

Thus, for cells containing the pattern of the inner area, the pattern of cells before the division of the boundary area is extracted from the cell library (S102). The reason why the pattern of cells before the division of the boundary area is that, in order to execute optical proximity correction of the pattern of the inner area, the pattern of all the object cells including the boundary area is required.

Then, the pattern data processing system executes optical proximity correction solely on the pattern of all the object cells (S103). The CPU 1006 which executes this processing corresponds to the device which performs optical proximity correction on the basis of the pattern of the first cell area. Incidentally, optical proximity correction (OPC) is processing by which an optical proximity effect (OPE) is predicted by simulation based on physical models of exposure and development, the required extent of mask pattern correction is figured out on the basis of the predicted values, and the sides of the pattern are moved on data for reticle production or the pattern shape is altered. This correction on the data reduces if not suppresses the phenomenon of deviation of the pattern shape formed on the semiconductor substrate from the designed shape.

In optical proximity correction, a rulebase OPC by which the designed pattern is corrected on the basis of correction rules (OPC rules) set forth in advance or a modelbase OPC by which the designed pattern is corrected by a simulator which models phenomena in the lithographic process is selectively used according to the layer to be applied.

As tools for the rulebase OPC, first, correction rules combining various ways of graphic processing are set forth in advance experimentally or otherwise. More specifically, they are a set of rules applicable to a pair of line patterns regarding the extent of alteration to narrow or expand the line width in accordance with the line width or the dimensions of the adjacent space. Line correction is accomplished in accordance with these rules. Also, to deter if not prevent the tip of a line pattern to be transferred (patterned) thinly, hammerhead correction is performed by which a rectangular graphic form is added to the tip of the line pattern. Further, to deter if not prevent corners of a square pattern from being patterned in a retreated state, serif correction to add rectangles to the convex corners of the square pattern is performed. Also, to deter if not prevent concave corners, e.g., of an L-shaped pattern, from being patterned in a stout state, inset correction to cut into the concave corners is performed.

In the modelbase OPC, any difference between the mask pattern and the transferred pattern on a semiconductor substrate is calculated by simulation on the basis of original design data, and the sides of pattern data are so moved as to obtain a shape exactly conforming to the design data.

Next, the inner area is extracted from the object cell, and substituted for the data of the object cell in the design data (S104). Incidentally, to extract the inner area from the object cell, the AND operation of the rectangular area surrounded by the cell correction boundary line and the pattern having gone through proximity correction can be executed.

On the other hand, cells containing the pattern of the boundary area are merged (synthesized) with the peripheral pattern in the design data (S105). The peripheral pattern here means the pattern of the cell adjoining the outside of the object cell. For instance, in simple processing, the peripheral pattern can be obtained by removing cells containing the pattern of the inner areas and developing the remaining data in a flat way. Then, optical proximity correction is executed on the pattern of the boundary area containing the peripheral pattern (S106). The CPU 1006 which executes this processing corresponds to the device which performs proximity correction on the basis of the relationship between the pattern contained in the first area and the pattern arranged around the first cell area.

Next, the pattern data processing system determines whether or not processing of every cell to be corrected has been completed (S107). If there is any cell to be corrected not yet processed, the pattern data processing system returns the control to S100. Or if every cell to be corrected has been processed, the pattern data processing system synthesizes the inner area with the pattern of the boundary area synthesized with the peripheral pattern (S108). After that, the fracturing 103 shown in FIG. 10 can be executed.

<Configuration of Mask Manufacturing System>

Figure 14:
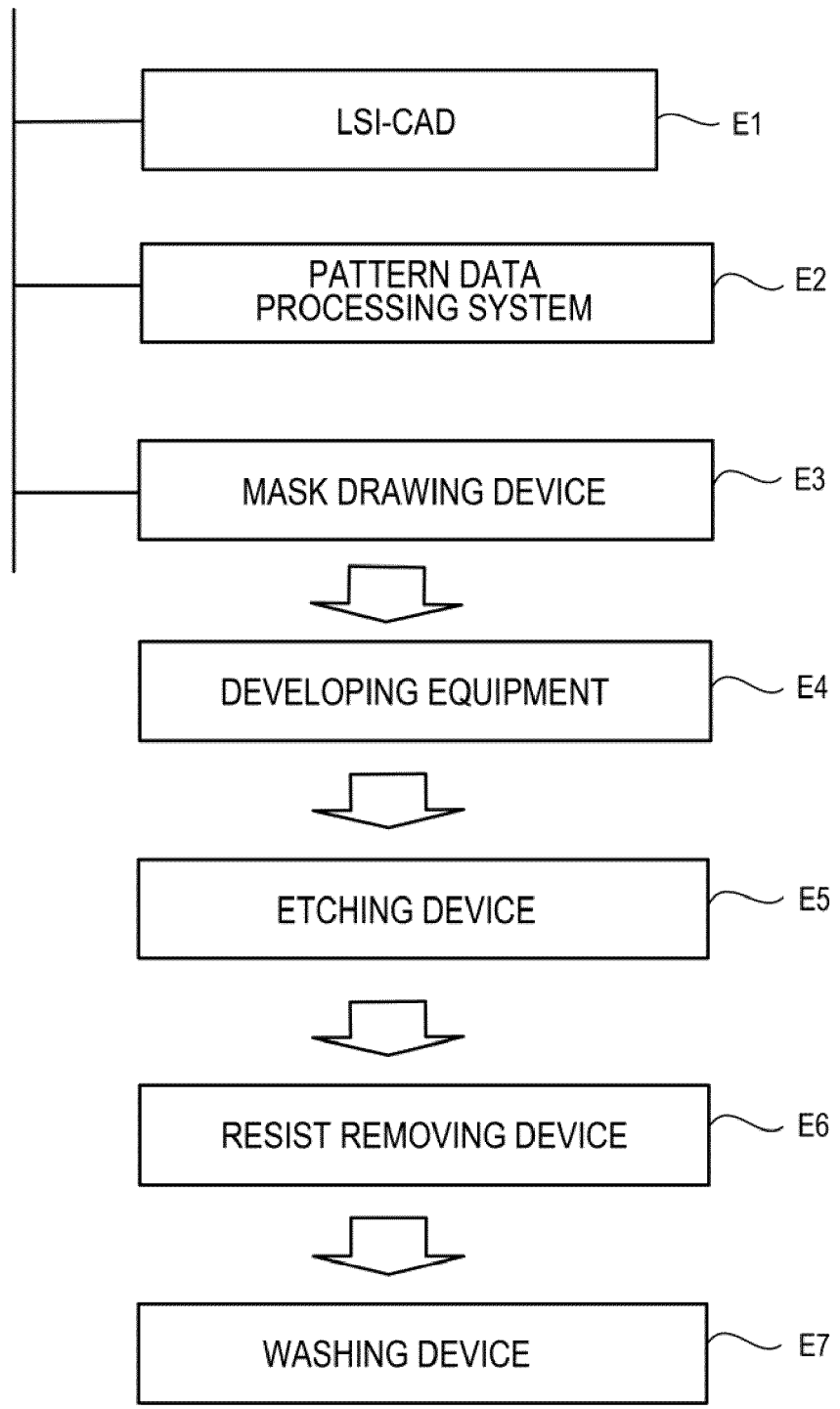
FIG. 14 shows an example of configuration of a mask manufacturing system including a pattern data processing system.

FIG. 14 shows an example of configuration of a mask manufacturing system including this pattern data processing system. First, the design data to be processed by this pattern data processing system are prepared by an LSI-CAD E1. The design data are delivered to the pattern data processing system (a pattern data processing system E2) through a network or a detachable recording medium, and the processing charted in FIG. 12 is executed. The LSI-CAD E1 and the pattern data processing system (the pattern data processing system E2) may as well be realized on the same computer.

Next, the design data having gone through the processing charted in FIG. 12 by the pattern data processing system are converted into drawing data for the mask drawing device (the fracturing 103 in FIG. 10) and delivered to the mask drawing device. Incidentally, this pattern data processing system may as well be integrated with a control computer attached to the mask drawing device. In that case, the fracturing 103 in FIG. 10 may be executed by the control computer attached to the mask drawing device.

Then in the mask drawing device E3, on the basis of the drawing data, a glass substrate covered by a light shield and further coated with a resist is exposed to an electron beam, laser or the like. After the drawing, the resist is developed by developing equipment E4. This causes the part of the resist corresponding to the pattern (or parts other than the pattern) to be removed.

Further, etching that uses the developed resist as the mask is executed by an etching device E5. This causes the light shield to be removed from where the resist has been eliminated by the development to expose transparent glass, enabling the pattern corresponding to the pattern (or parts other than the pattern) to transmit light.

Next, a resist removing device E6 removes any resist remaining on the glass substrate. Further, the glass substrate is washed by a washing device E7, and the patterning on the mask is completed. In some cases, a transparent thin film (pellicle film) for deterring if not preventing foreign matter from sticking may be added all over the substrate on which the light shield and the glass surface have formed the pattern.

As hitherto described, the pattern data processing system of this embodiment divides the object cell subject to correction processing, such as optical proximity correction, into a range where the influence of patterns outside the cell reaches and a range where it does not. The range where the influence of patterns outside the cell reaches, together with the peripheral pattern outside the cell, correction processing is executed. The range where the influence of patterns outside the cell does not reach, the cell by itself is subjected to optical proximity correction. In this way, the range where the influence of patterns outside the cell does not reach can be subjected to optical proximity correction with the regularity of cells maintained.

Maintaining the regularity of cells here means, for instance the same cells are arranged many times with reiterative reference, maintaining that structure of arrangement. For instance regarding the inner areas of cells, even if optical proximity correction is executed, the same pattern can be obtained after the correction, and accordingly a state in which the same cells are arranged many times with reiterative reference can be maintained. Regarding the boundary areas on the other hand, the pattern is deformed depending on the cells adjoining the outside of the cell to be corrected.

However, by reconstruction into the hierarchical structure shown in FIG. 3, even if cells outside the object cell are altered, optical proximity correction can be readily executed. Therefore, even if the same cells are incorporated into LSI circuits of different types, the result of proximity correction already accomplished can be utilized as it is in the range where the influence of any pattern outside the cell does not reach. If cells have reiterative regularity, that regularity can be maintained.

On the other hand, the boundary areas, together with cells adjoining the outside of the cells to be corrected, can be subjected to proximity correction in the same procedures as S105 and S106 of FIG. 13 referred to above. Therefore, proximity correction reflecting the influence of the peripheral pattern can be executed limited to the boundary parts of cells and, even when proximity correction is executed again, it can be accomplished very efficiently, allowing savings in computer resources, and processing can be completed in a shorter period of time than proximity correction giving heed to every possible pattern.

This processing method makes possible efficient correction processing of pattern data while deterring if not suppressing the increase in the quantity of pattern data to be substantially processed.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A computer-implemented method of processing design data to obtain photomask data, the computer-implemented method comprising:
    selecting a first cell in a design data including a hierarchical structure;
    selecting a first area in said first cell for which a configuration of a corresponding first pattern is influenced by patterns arranged outward relative to said first cell area;
    selecting a second area other than said first area in said first cell;
    constructing a hierarchical structure including said first area and said second area as new cell area thereof belonging to branches positioned immediately below the first cell;
    subjecting the first area to optical proximity correction on the basis of a relationship between the first pattern and the patterns arranged around said first cell area;
    performing optical proximity correction in said second area on the basis of the first pattern; and
    synthesizing the corrected first area and the corrected second area, according to the hierarchical structure, to obtain photomask data.

2. The method of processing photomask data according to claim 1, wherein:
    said second area is defined as areas for which corresponding patterns do not exhibit more than a threshold amount of variation.

3. The method of processing photomask data according to claim 1, wherein:
    the first mask pattern and a pattern in said second area are in the same layer.

4. The method of processing photomask data according to claim 1, wherein a configuration of a second pattern corresponding to said second area substantially is not influenced by the patterns arranged outward of said first cell area.

5. The method of processing photomask data according to claim 1, wherein the second area is located inward of the first area.

6. The method of processing photomask data according to claim 1, further comprising:
    fracturing the photomask data.

7. A photomask data processing system for manipulating design data to obtain photomask data, the system comprising:
    a first selecting unit to select a first cell in a design data including a hierarchical structure;
    a demarcating unit to demarcate a first area within said first cell area wherein a shape of a corresponding first pattern is influenced by adjacent patterns corresponding to areas outward relative to said first cell area;
    a second selecting unit to select a second area other than said first cell area in said first area;
    a constructing unit to construct a hierarchical structure including said first area and said second area as new cell area thereof belonging to branches positioned immediately below the first cell;
    a first correcting unit to subject a first area to proximity correction on the basis of a relationship between the first pattern and the adjacent patterns;
    a second correcting unit to perform proximity correction in said second area on the basis of the pattern of said first cell area; and
    a synthesizing unit to synthesize the corrected first area and the corrected second area, according to the hierarchical structure, to obtain photomask data.

8. The system according to claim 7, wherein:
    said second area is defined as areas for which corresponding patterns do not exhibit more than a threshold amount of variation.

9. The system according to claim 7, wherein:
    the first mask pattern and a pattern in said second area are in the same layer.

10. The system according to claim 7, wherein a configuration of a second pattern corresponding to said second area substantially is not influenced by the patterns arranged outward of said first cell area.

11. The system according to claim 7, wherein the second area is located inward of the first area.

12. A photomask manufacturing method comprising:
    a computer-implemented method of manipulating design data to obtain photomask data, the computer-implemented method including the following,
        selecting a first cell in a design data including a hierarchical structure,
        selecting a first area in said first cell for which a configuration of a corresponding first pattern is influenced by patterns arranged outward relative to said first cell area,
        selecting a second area other than said first area in said first cell,
        constructing a hierarchical structure including said first area and said second area as new cell area thereof belonging to branches positioned immediately below the first cell,
        subjecting the first area to optical proximity correction on the basis of a relationship between the first pattern and the patterns arranged around said first cell area,
        performing optical proximity correction in said second area on the basis of the first pattern, and
        synthesizing the corrected first area and the corrected second area, according to the hierarchical structure, to obtain photomask data; and
    producing a photomask on the basis of said photomask data.

13. The photomask manufacturing method according to claim 12, wherein:
    said second area is defined as areas for which corresponding patterns do not exhibit more than a threshold amount of variation.

14. The photomask manufacturing method according to claim 12, wherein:

the first mask pattern and a pattern in said second area are in the same layer.

15. The photomask manufacturing method according to claim 12, wherein a configuration of a second pattern corresponding to said second area substantially is not influenced by the patterns arranged outward of said first cell area.

16. The photomask manufacturing method according to claim 12, wherein the second area is located inward of the first area.

17. The photomask manufacturing method according to claim 12, further comprising:

fracturing the photomask data before producing the photomask;

the photomask being produced on the basis of the fractured photomask data.

* * * * *